(12) United States Patent
Carlson et al.

(10) Patent No.: US 8,763,414 B2
(45) Date of Patent: Jul. 1, 2014

(54) WARM FLOOR DATA CENTER

(75) Inventors: Andrew B. Carlson, Atherton, CA (US);
Jimmy Clidaras, Los Altos, CA (US);
William Hamburgen, Palo Alto, CA (US)

(73) Assignee: Google Inc., Mountain View, CA (US)

(*) Notice: Subject to any disclaimer, the term of this patent is extended or adjusted under 35 U.S.C. 154(b) by 672 days.

(21) Appl. No.: 12/060,165

(22) Filed: Mar. 31, 2008

(65) Prior Publication Data

US 2009/0241578 A1 Oct. 1, 2009

(51) Int. Cl.
*F25D 23/12* (2006.01)
*H05K 7/20* (2006.01)
*F25D 17/06* (2006.01)

(52) U.S. Cl.
CPC .... *H05K 7/20745* (2013.01); *F25D 2317/0661* (2013.01); *F25D 2317/0651* (2013.01); *F25D 17/06* (2013.01)
USPC .......... 62/259.2; 454/184; 361/695; 52/220.2

(58) Field of Classification Search
USPC ............ 62/259.2; 361/695; 415/26; 454/184; 52/220, 220.2, 220.3
See application file for complete search history.

(56) References Cited

U.S. PATENT DOCUMENTS

| | | | |
|---|---|---|---|
| 4,992,669 A * | 2/1991 | Parmley | 290/1 R |
| 5,345,779 A | 9/1994 | Feeney | |
| 5,953,930 A * | 9/1999 | Chu et al. | 62/259.2 |
| 7,011,576 B2 * | 3/2006 | Sharp et al. | 454/184 |
| 2002/0055329 A1 * | 5/2002 | Storck et al. | 454/186 |
| 2005/0170770 A1 * | 8/2005 | Johnson et al. | 454/184 |
| 2007/0171613 A1 * | 7/2007 | McMahan et al. | 361/695 |
| 2007/0281639 A1 * | 12/2007 | Clidaras et al. | 455/128 |
| 2008/0164794 A1 * | 7/2008 | Lai et al. | 312/298 |

FOREIGN PATENT DOCUMENTS

| | | |
|---|---|---|
| CN | 1543758 A | 11/2004 |
| CN | 1732727 A | 2/2006 |
| JP | 11-148710 | 6/1996 |
| JP | 11148710 | 6/1999 |
| JP | 2003-035441 | 2/2003 |
| JP | 2003035411 | 2/2003 |
| WO | WO2007139560 A1 | 12/2007 |

OTHER PUBLICATIONS

Notification of Transmittal of the International Preliminary Report on Patentability (2 pages) and the Written Opinion of the International Searching Authority, (5 pages), mailed Oct. 14, 2010, for related international application PCT/US2009/039011.

Examiner Hyun Soo Park, International Search Report & Written Opinion for Application No. PCT/US2009/039011, dated Oct. 09, 2009, 12 pages.

(Continued)

*Primary Examiner* — Cassey D Bauer
(74) *Attorney, Agent, or Firm* — Fish & Richardson P.C.

(57) ABSTRACT

A data center cooling system includes a floor structure defining a below-floor warm-air plenum and an above-floor cool air plenum, a plurality of above-floor computer assemblies arranged to exhaust warmed air into the warm-air plenum, and one or more fan-coil arrangements to draw air from the warm-air plenum, cool the air, and provide the air to the cool air plenum. The volume of the above-floor cool air plenum and the below-floor warm air plenum may both be substantial so as to minimize changes in temperature from the failure of components in the system.

27 Claims, 10 Drawing Sheets

(56) References Cited

OTHER PUBLICATIONS

Examiner Yarong Zhou et al., Notification of the Second Office Action for Application No. 200980117359.4, issued Aug. 16, 2013, 26 pages.

Examiner Hatinder Sharma, Patent Examination Report No. 1 for Application No. 2009251675, issued Jan. 11, 2013, 4 pages.

Examiner Yarong Zhou et al., Notification of the First Office Action for Application No. 200980117359.4, issued Dec. 18, 2012, 14 pages.

* cited by examiner

WARM FLOOR DATA CENTER

TECHNICAL FIELD

This document relates to techniques for providing cooling for areas containing electronic equipment, such as computer server rooms and server racks in computer data centers.

BACKGROUND

With consumers using their computers more-and-more for heavy duty on-line applications, the need for computer data centers has increased greatly. Data centers are centralized computing facilities that include hundreds, thousands, or even hundreds of thousands of computers, often arranged into numerous computer racks. Data centers are extremely important to modern computing and are also extremely expensive to build and operate.

Expenses for building data centers include land acquisition and standard building costs for the facility. In addition, thousands of computers and ancillary equipment must be purchased and installed. And electrical and mechanical equipment is needed to power and cool the equipment.

Operation of a data center is expensive because fast computers are needed and fast computers require electricity. As an unfortunate corollary, fast computers turn that electricity into heat, requiring more electricity to eliminate the heat. For example, many buildings use chillers, condensers, evaporators and other energy-consuming devices to cool a facility. And such devices require fans, pumps, and other ancillary electrically-powered equipment.

SUMMARY

This document describes systems and techniques for removing heat efficiently from areas supporting electronic equipment, such as in data centers. Many of the examples described here involve capturing in a warm air plenum most or all of the air that is heated by the electronic equipment, wherein the warm air plenum is located beneath a floor in the data center. The warmed air may then be gathered from that space, cooled, and re-circulated back into the main workspace of the data center, where it can be circulated back over the electronic equipment again. Other warm air plenums, or extensions of the under-floor plenums, may be located at the backs of computer racks that hold the electronic equipment, so that air is drawn over computers in the racks from the workspace, exhausted into the plenums and then drawn down through the back-of-rack plenums to the under-floor space.

Air circulation and cooling equipment may be arranged in a variety of manners in such systems. As one example, small circulation fans may be provided with each computer motherboard or small groups of motherboards, and main circulation fans may be provided in or near the under-floor space. The smaller fans may be used to maintain control over per-board circulation so as to prevent the creation of hot spots, and to ensure that each board has close control. Closer, more responsive control helps prevent too slow of response which can cause a board to overheat, and too fast of response (with overcorrection perhaps) which can cause a board to take a disproportionate share of a facility's cooling resources. The larger fans may be used to move the air into and distribute the air within the workspace, and to overcome the pressure drop of cooling coils that cool the air from the under-floor space.

Various arrangements of the fans and cooling coils may be employed. For example, both fans and coils may be located in the under-floor space, with the fans either drawing air through or pushing air through the coils. Also, the coils may be placed horizontally at floor level with the fans above or below, or may be located fully within the under-floor space at a vertical or angled orientation. In addition, pressurized plenums may be provided, with multiple fans providing air to a single plenum and multiple coils allowing air to pass out of the plenum. The fans may take a variety of constructions, including axial and centrifugal fans.

Providing a warm air plenum of substantial size (e.g., under a data center floor) that is separate from a cool air plenum of substantial size (e.g., filling a data center workspace) can provide one or more benefits in certain implementations. For example, where the two plenums are large and share air from multiple parts of a system, the air may have a large thermal mass on both the warm and cool sides, and may thus resist changes in operating conditions, so that it may exhibit more consistent operation. A large shared plenum allows averaging the effect of variations in the board outlet temperature. Also, where multiple racks of computers, multiple coils, and/or multiple fans feed or draw from a common plenum, break-downs in one cooling unit such as a fan or cooling coil, may be taken up by the other cooling units. Although the temperature of the air in such a situation might be slightly higher than before the breakdown, the warmed air from the broken equipment can be blended with air from many other areas, so that the overall effect will be negligible, and all or most of the computers can stay on-line and operational. Similar positive effects may be taken advantage of when performing maintenance on a facility. Moreover, by cooling the air before it enters the workspace, less or no mixing may be required in the workspace, so that the temperature of the air as it enters the computers is more consistent and so that the overall system may be designed confidently for a higher incoming air temperature without the danger of hotspots. Such a higher incoming air temperature may be achieved with only cooling towers, and not use chillers.

Also, when additional small fans or other air flow control mechanisms are provided at the computers, the air temperature rise across the computers may be safely raised, so as to creating particularly high temperatures in the warm air plenum. Such higher temperatures may permit a system to operate more efficiently because greater amounts of heat may be drawn out of the high temperature air by a given amount of cooling water at a given temperature. This results in an overall smaller cooling plant size compared to one of similar capacity, but running at the lower warm air temperatures.

Such slow circulation may be aided by operating the larger fans in the system that pull air out of the warm air plenum and drive the air through the cooling coils so that each tray faces a constant pressure difference across it. As such, the fans at the computers will experience predictable operating parameters and can be operated relatively reliably at very low speeds and volumes. Also, controlling individual units such as a tray or group of trays to maintain a set exit temperature (and by extension, a set temperature rise), and controlling more general fans to maintain a set pressure difference (rather than temperature controlling those fans to a temperature or temperature difference), which may be zero, may help prevent the two components of the overall system from "fighting" with each other.

Finally, capturing the server exhaust in a warm air plenum and treating (cooling) it before releasing it into a facility results in much more predictable and uniform air temperatures at the inlet of the servers. This allows one to design for a higher average inlet temperature, rather than the peaks associated with releasing un-cooled air from the servers back into the facility. In addition, segregation of warm air zones from cold air zones may help prevent thermal short circuits, where localized warm air may be pulled back through a rack.

In some implementations, a data center cooling system is disclosed that includes a floor structure defining a below-floor warm-air plenum and an above-floor cool air plenum, a plurality of above-floor computer assemblies arranged to exhaust warmed air into the warm-air plenum, and one or more fan-coil arrangements to draw air from the warm-air plenum, cool the air, and provide the air to the cool air plenum. The system can also include a vertical plenum that fluidly connects the computer assemblies to the warm-air plenum through an opening defined in the floor structure. The one or more fan-coil arrangements can include one or more packaged fan-coil units, and the warm-air plenum and the cool-air plenum can be sized in volume and shaped in section to substantially eliminate temperature hot spots created by failures of the fan-coil arrangements. In some aspects, the warm-air plenum defines a volume that is at least 20 percent as large as a volume defined by the cool-air plenum.

In certain other aspects, the plurality of computer assemblies comprise a plurality of vertical racks arranged in a row exhausting warmed air into a vertical plenum that is in fluid communication with the below-floor warm air plenum. The system can also comprise air circulation fans adjacent to the computer assemblies and fan controllers configured to maintain a set exit air temperature from the computer assemblies. Moreover, the system can comprise air circulation fans adjacent to the computer assemblies and fan controllers configured to maintain a maximum safe operating temperature for components on the computer assemblies. Also, the system can include a fan-coil assembly controller configured to maintain a set pressure difference between the warm-air plenum and the cool-air plenum. The set pressure difference can, for example, be approximately zero.

In another implementation, a method of operating a cooling system for a data center is disclosed. The method comprises circulating air across a plurality of computers to remove heat accumulated by the computers, capturing the air in an above-floor warm air plenum and directing the air downward into a below-floor warm air plenum, and capturing the warmed air, cooling the warmed air, and providing the cooled air to an above-floor workspace. The method may also include continuously circulating the air across the computers, into the below-floor warm air plenum, through the circulation and cooling equipment, and back into the workspace. Providing the cooled air can comprise circulating the warmed air through an under-floor cooling coil using an under-floor fan, and circulating air across the plurality of computers can comprise drawing the air across the computers using fans located adjacent the computers.

In certain aspects, the method further comprises controlling the fans located adjacent the computers to maintain set exit air temperatures from the computers. Also, the below-floor warm air plenum is, in certain aspects, at least 20 percent the volume of the above-floor cold-air plenum.

In yet another implementation, a data center cooling system is disclosed. The system comprises a data center workspace providing cooling air to a large plurality of computer assemblies, a warm-air plenum receiving air circulated past and warmed by the computer assemblies, and a data center floor defining, at least in part, a barrier between the data center workspace and the warm-air plenum. The system can further comprise a plurality of air circulation fans in the warm-air plenum and a plurality of cooling coils associated with the air circulation fans located at an edge of the warm-air plenum. The air circulation fans can be configured to draw air out of the warm-air plenum and supply the air, after cooling by the cooling coils, to the workspace. Also, the datacenter workspace can be contained in one or more modular computing frames containing the computer assemblies and the warm-air plenum is contained in one or more modular mechanical frames configured to be joined to the one or more first modular frames. Moreover, the system can include a first modular workspace frame stacked on top of a second modular workspace frame, which is in turn stacked on top of a mechanical frame.

The details of one or more embodiments are set forth in the accompanying drawings and the description below. Other features, objects, and advantages will be apparent from the description and drawings, and from the claims.

DESCRIPTION OF DRAWINGS

FIG. 1b shows a front section view of the data center in FIG. 1a.

FIG. 1c shows a side section view of a particular fan coil unit from FIG. 1a

FIG. 1d shows a plan view of a piping layout for the data center of FIG. 1a.

FIG. 2b shows a sectional view of the data center from FIG. 2a.

FIG. 3b shows a sectional view of the data center from FIG. 3a.

FIG. 4b shows an end section view of the data center of FIG. 4a.

FIG. 4c shows a detail view of a lifting connector for the data center of FIG. 4a.

FIG. 4d shows a partial plan view of the data center of FIG. 4a.

Like reference symbols in the various drawings indicate like elements.

DETAILED DESCRIPTION

Figure 1A:
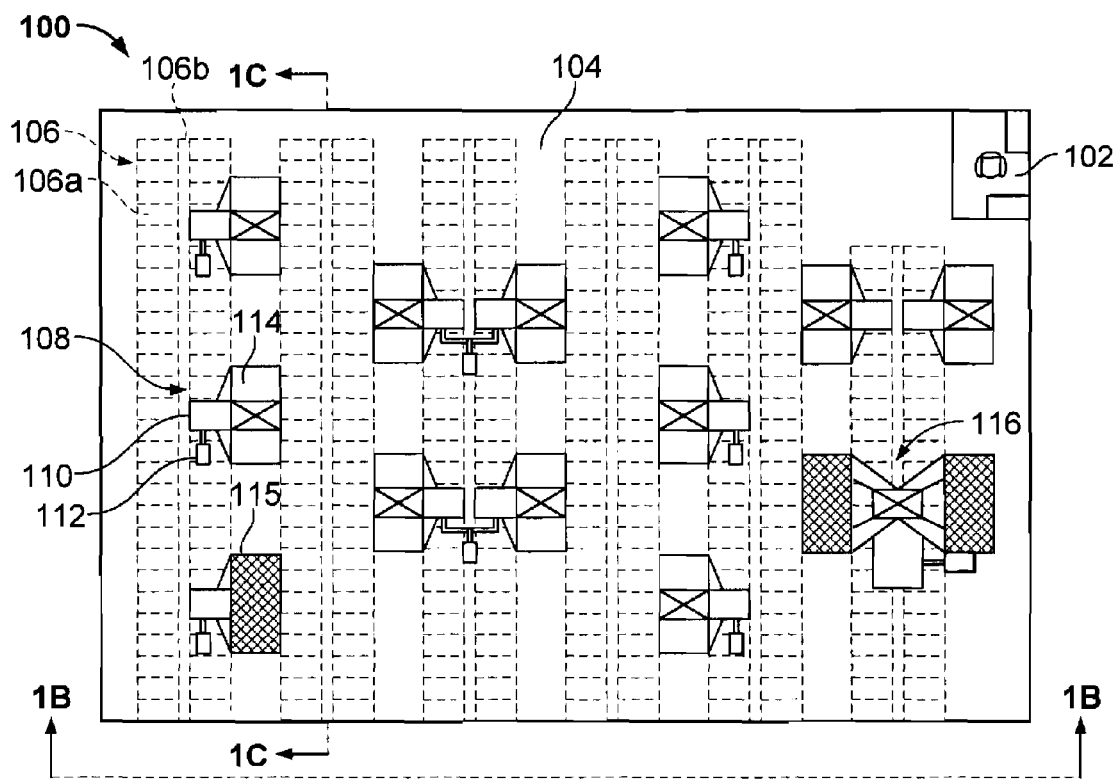
FIG. 1a shows a plan view of a data center air circulation layout.
Figure 1B:
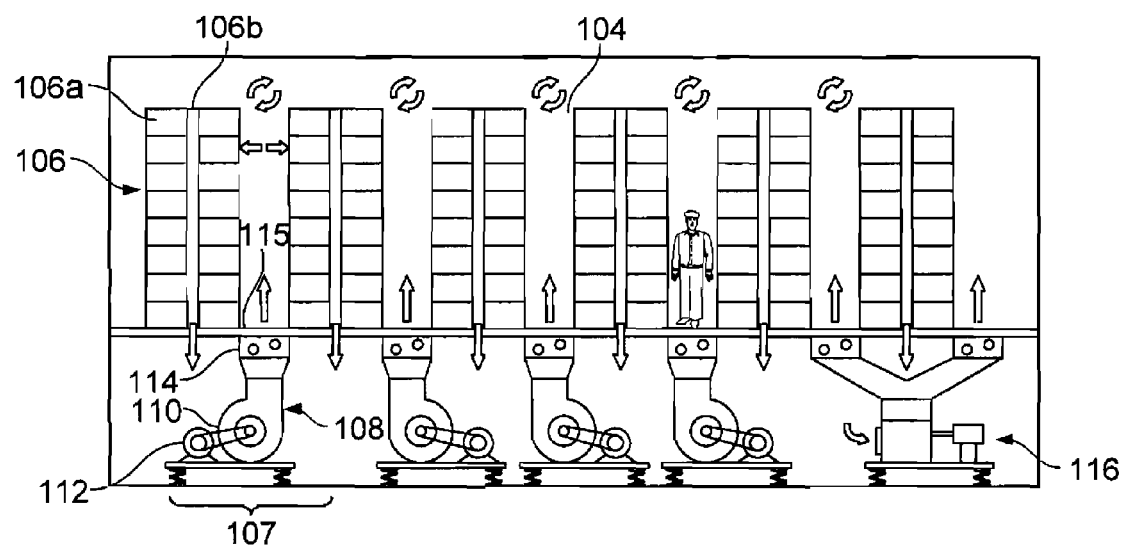

FIG. 1a shows a plan view of a data center 100 air circulation layout, while FIG. 1b shows a front section view of the data center 100 in FIG. 1a. In general, the system shown here provides a number of fan coil combinations that may be located under the floor of a standard data center 100. The data center 100 is shown in this example as a single story data center in a facility like a warehouse or other facility that is inexpensive and fast to construct. The facility may be built as a slab-on-grade facility, or may be provided as a two-story facility, where above-slab components include computers, and below-slab (basement) components include various cooling and other mechanical equipment, such as piping. Where the facility is slab-on-grade, the piping and mechanical equipment may be located below a standard raised floor. The electrical equipment for the computers (not shown) may in turn be located above or below the computers, while the electrical equipment for the mechanical equipment may be located below the floor.

The computers in the data center 100, shown in this example by dashed lines in the plan view of FIG. 1a, are arranged in parallel rows of racks that hold many computers. The computers may be in the form of computer motherboards on horizontal trays that are slid in and out of the racks, much like trays in a cafeteria rack or in a baker's bread rack. Other mechanisms for mounting the computers may also be used, such as by arranging the computers vertically, and providing mechanisms at a backplane of the computers for attachment of the computers. Each rack may include multiple vertical sections of computers, such as by including three sections in one rack. The rack itself may be mounted on wheels or other mechanisms for moving it into position with other racks.

In this example, racks in rows are shown paired-up in back-to-back arrangements. In particular, a main rack row 106 is made up of two parallel rows of racks 106a with their back edges separated slightly by a warm air plenum 106b. In operation, air may be drawn from a workspace 104, into the fronts of the racks 106a, across the computers in the racks, where it is warmed by the computer equipment, and may be directed out the backs of the racks into the plenum 106b. A cutout 105 may be provided in the floor of the data center at the bottom of each such plenum 106b so that warmed air may be drawn down from the plenum 106b and into an under-floor space 108. The under-floor space 108 may also serve as a warm air plenum itself, and may be relatively large in size. For example, where a raised floor is used, the under-floor space 108 may be approximately 2 feet or 4 feet in height or taller. Where a basement space or similar space is used, the under-floor space 108 may be 8 feet to 10 feet in height or taller.

The under-floor space 108 may be filled, as shown, with a number of fan coil units, such as unit 107. Such fan coil units may take a variety of forms, and need not be a single packaged unit that is frequently referred to as a fan-coil unit in the trade, and also need not have a particular ratio of fans to coils. For example, a plurality of fans may serve a single area that includes a single coil or a different number or plurality of coils. The particular arrangement of the fans and coils may depend on the manner in which a system is implemented.

In this example, fan coil units are shown with individual fans serving individual coils. Specifically, for example, in unit 107, a fan 110 is shown mounted to an isolation base and is drawing air out of under-floor space 108 to drive the air up through cooling coil 114. The coil 114 is mounted to the bottom of a flooring structure and fluidly connected to the fan 110 by a transition piece. The cooling coil 114 may be located, relative to the computer equipment, in a workspace aisle of the workspace 104. The coil 114 may be sized so as to be approximately the width of the workspace aisle, and sufficiently long so as to provide the appropriate level of cooling for the space. For example, the cooling coil 114 could be approximately three feet wide and approximately six feet long.

A grate 115 may be located over the coil 114 to protect the coil, and to allow users and equipment in workspace 104 to pass over the coil. The grate 115 may be removable, such as by locating a metal grate over a hole having flanges around its perimeter, much like a man-hole cover, so that the grate 115 may be removed and the coil 114 may be accessed for servicing or other purposes. In addition, an access panel (not shown) may be provided adjacent to the grate 115 and the coil 114, such as to provide convenient access to valving or other piping that connects the cooling coil 114 to a cooling system.

In other arrangements, a single fan may be connected fluidly to multiple coils. For example, ductwork may be provided from the top of a fan and spread up and down a passageway in a data center so that coils that are spaced apart from each other may be served by the single fan. Also, coils in adjacent rows may be served by a single fan, such as where the fan may be located underneath a role of computers that lies between the adjacent workspace rows. Such an arrangement is shown, for example, by fan-coil unit 116. Such an arrangement, where a single unit powers adjacent rows, may result in beneficial diversity in a cooling system. For example, if the fan-coil unit 116 breaks down, such a problem will result only in the loss of service to one coil in each aisle, rather than of multiple coils in each aisle. As a result, the problem may be spread around the data center, and air cooled by other coils in the same workspace row may be mixed up and down a row with the relatively warm air near the broken fan-coil unit.

Other arrangements of fans to coils may also be employed. For example, multiple fans may serve a single coil so as to provide redundancy if one fan goes out of service. Likewise, multiple fans may serve multiple coils. Such an arrangement may provide even greater redundancy and diversity in the operation of the ventilation and cooling system.

The fans in the system, such as fan 110, may each be associated with a particular motor driving the fan, such as motor 112. In certain situations shown here, such as in the second aisle from the left in the data center 100, a single motor may be used to drive more than one fan. Such an arrangement may permit for more energy-efficient operation of the system, and for sizing larger motors that will draw less electricity per unit of air moved. In addition, use of motors on multiple fans may lower the amount of maintenance and repair that is needed in the system, and lower the installation costs and start up times for the system.

Ancillary services may also be provided for the dater center equipment that has been described so far. For example, in FIG. 1A a data center office 102 may be provided where an operator of the data center equipment may track the operation on a computer terminal or other similar mechanism. For example, the operator may be shown temperatures in the system and airflow rates in the system to determine whether the equipment in the data center 100 is being adequately cooled. In addition, alerts may be provided to the operator when equipment breaks or temperatures exceed certain levels, so that the operator may quickly diagnose and rectify any problems.

In addition, though not shown, the data center 100 may be provided with other ancillary systems, such as makeup air systems and electrical systems for powering the various equipment. Makeup air may be provided via well-known techniques, such as by outside air intake that is filtered and potentially cooled and humidity conditioned. In one example, makeup air may be provided through the office 102 with a cooling unit that uses a compressor, chiller, or similar powered cooling system. As such, the main workspace 104 of the data center may be free-cooled with cooling tower water, and may be maintained at an elevated temperature, while the office 102 may be kept at a lower temperature using more energy-intensive cooling equipment. The overall energy consumption may still be reduced dramatically, however, because the office 102 has a much lower heat load then do the other areas of the data center 100, where high density and high heat-producing computing equipment may be located. As a result of using higher operating cost equipment only for particular areas where it is required for human comfort, the data center 100 may operate at a substantially reduced cost.

Figure 1C:
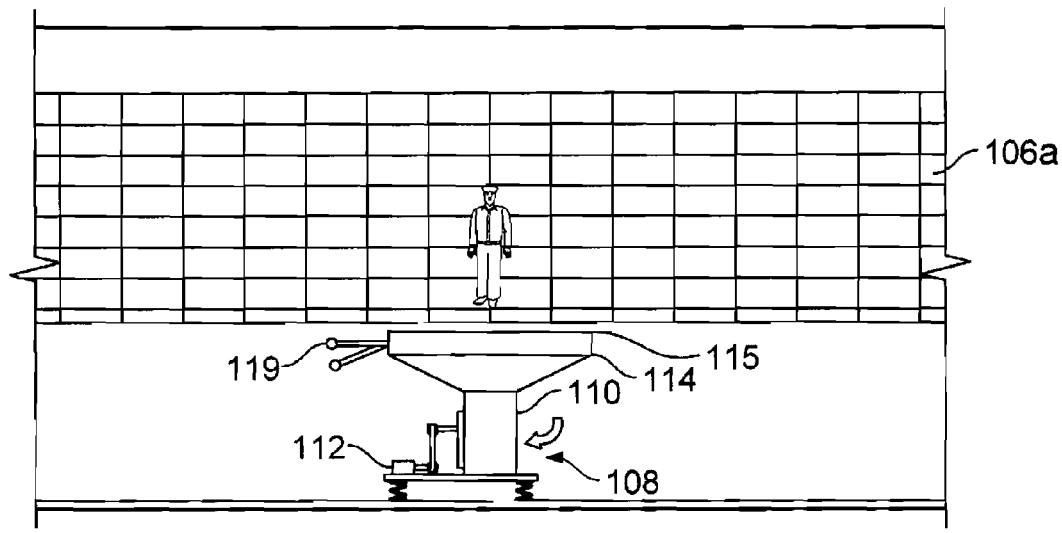

FIG. 1c shows a side section view of a particular fan coil unit 108 from FIG. 1a. This view better shows the ductwork transition needed to connect a fan outlet to the coil 114 in the coil's longer dimension. In addition, this view also shows the multiple racks 106a in a row of racks 106 in the data center. In this example, each vertical portion of the racks is approximately 19 inches wide, while the coil is approximately the width of a three section rack, or about 60 inches in width. Here, the fan coil unit 108 includes a fan 110 on an isolation base with a driving motor 112 that is connected to the fan by a belt, with a sheet-metal transition area extending upward from the fan 110 to connect to coil 114. In normal operation, air would be drawn in one side or both sides of the fan 110, as shown by the arrow in the figure, and driven upward through the coil and into the workspace past the feet of workers standing above.

The figure also shows cooling piping 119. Such piping 119 may be routed along paths beneath the floor or in other locations so as to come near the various cooling coils in the system. Piping take offs, which may include flexible piping sections, may be provided between the main pipe runs and the cooling coils, such as coil 114. The cooling piping 119, which may consist of supply piping and return piping, may be arranged so as to lead back to one or more header pipes. The size of the header pipes may increase as they approach the cooling plant or plants.

Figure 1D:
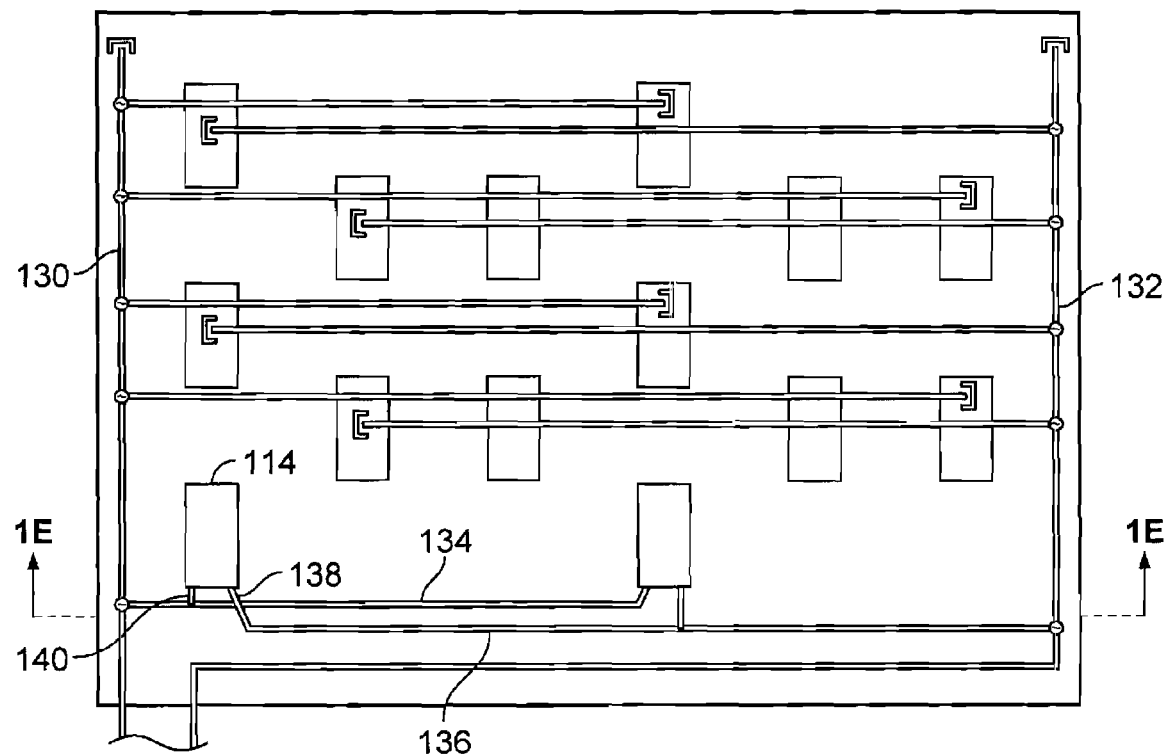
Figure 1E:
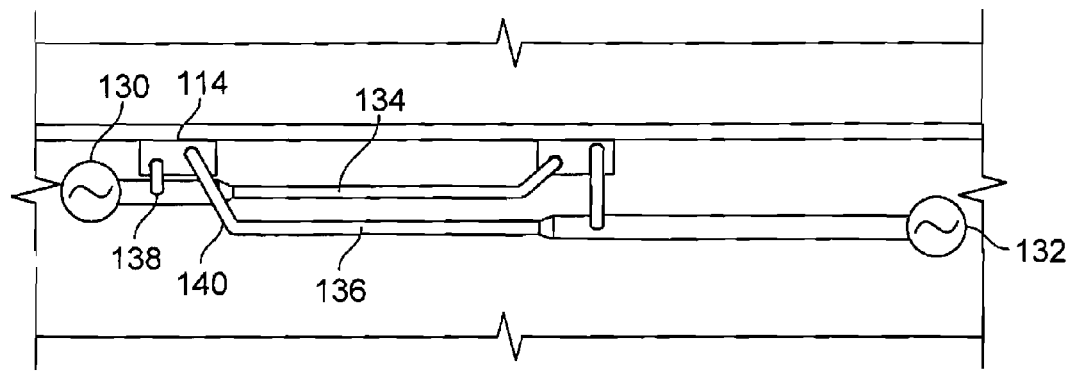
FIG. 1e shows a front section view of the data center in FIG. 1d.

FIG. 1d shows a plan view of a piping system layout for the data center of FIG. 1a, while FIG. 1e shows a front section view of the data center in FIG. 1d. The piping system generally comprises a cooling water supply header 130, and a cooling water return header 132. In general, water will be pumped into the system from an external source, such as an evaporative cooling loop connected to a cooling tower, to the supply header 130 (or a loop connected to the evaporative loop via a heat exchanger). The water may then be forced down a series of supply pipes in a ladder arrangement or other arrangement, such as supply pipe 134. Such cooling supply water may then be provided to take offs, which may be flexible or other connections, to individual coils such as take off 138 connected to cooling coil 114. After circulating through the coil 114, the cooling water, which will have by this time been warmed up by air passing through the coil 114, may pass out of the coil through take off 140 and into return pipe 136. The water may then be passed to return header 132, and out to a system such as an evaporative cooling system, and cycled back around again after being cooled.

Various ancillary components that are not shown may also be provided in such a system, as would be understood by a skilled artisan. For example, shut-off valves may be provided at each piping take off, and for each coil, to permit coils to be removed and other sections of the system to be removed for maintenance. In addition, header shut-off valves may permit for sequential commissioning of a system, where main headers may be installed initially and computing equipment may then be installed, connected to, and brought online, while others parts of the system have yet to be installed. In addition, the system may include other components such as balancing valves that may be used to ensure sufficient water flow to all parts of the system, including distant portions of the system that will face additional friction and restraints from flow, and may thus otherwise be starved of cooling water if the system is not properly balanced. Pumps, filters, and other similar components may also be provided as needed, as would be understood by a skilled artisan.

The particular piping arrangement shown in FIG. 1d may be beneficial in providing diversity of operation in a data center cooling system. In particular, the supply pipes for the system run at an angle to the rows of servers in the system that is above the piping. As a result, each supply and return pipe may serve cooling coils that are in different rows of racks in the system and are spaced apart from each other in the system. Therefore, if one row of piping must be taken out of service, the effects will be felt by coils spaced across multiple rows of computers in the system. For example, if pipes 134, 136 are taken out of service, two coils that are in computer rows spaced three rows apart, will need to be taken down. The air served by those coils is widely separated and the cooled air from other coils in the same row can readily serve the computers in front of the "down" coil. If, in contrast, the pipes had run along with the rows and each pipe had served only a single row, all of the coils for that particular row could need to be taken out of service, and a hotspot of localized heating may result, or the computers facing that row may need to be taken off-line. Similar diversity effects may be obtained with piping that runs parallel to the rows of racks, by having each set of piping serve coils in different rows of racks (e.g., by having short and long take-offs from the piping in both directions from the piping).

The particular size of the data center 100 shown in these figures, and the number of cooling units and fan units provided with the data center, is shown here for illustration only. In general, a data center would require many more such cooling coils scattered throughout a generally larger area. The particular number of units and other pieces of equipment, and the pattern of the units as applied across a data center, may vary depending on the particular heating loads in the center and the capabilities of the equipment, as would be understood by a skilled artisan.

Figure 2A:
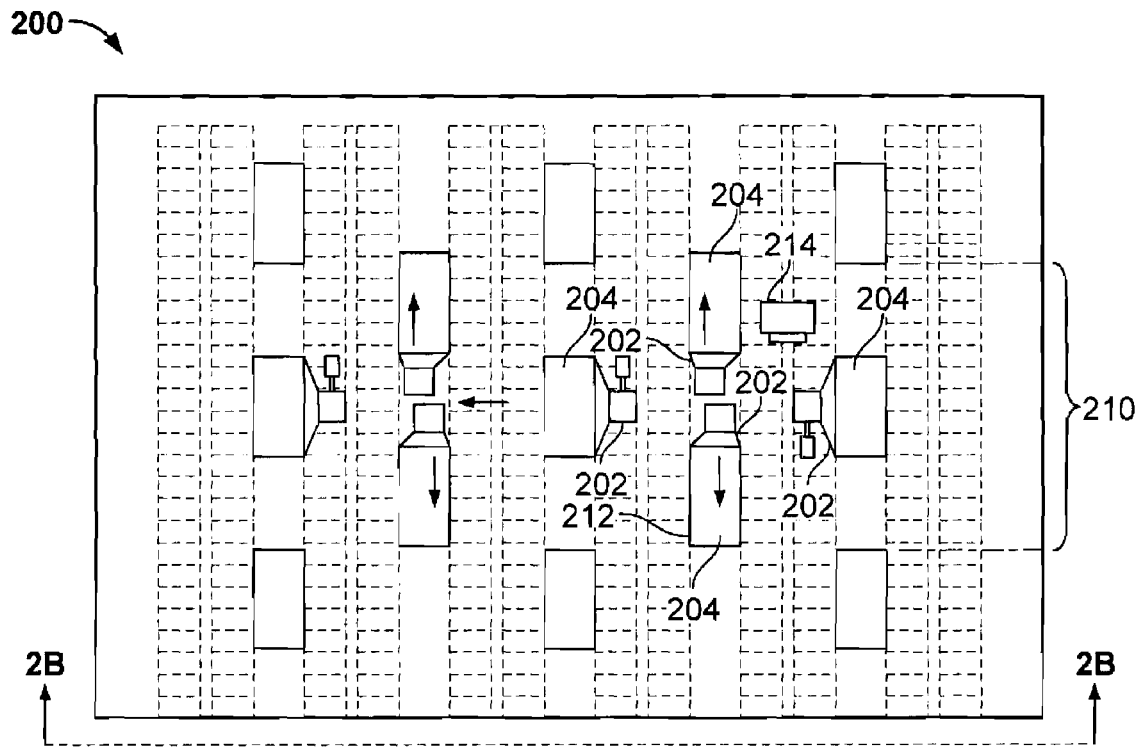
FIG. 2a shows a plan view of a data center having clustered fan coil units.
Figure 2B:
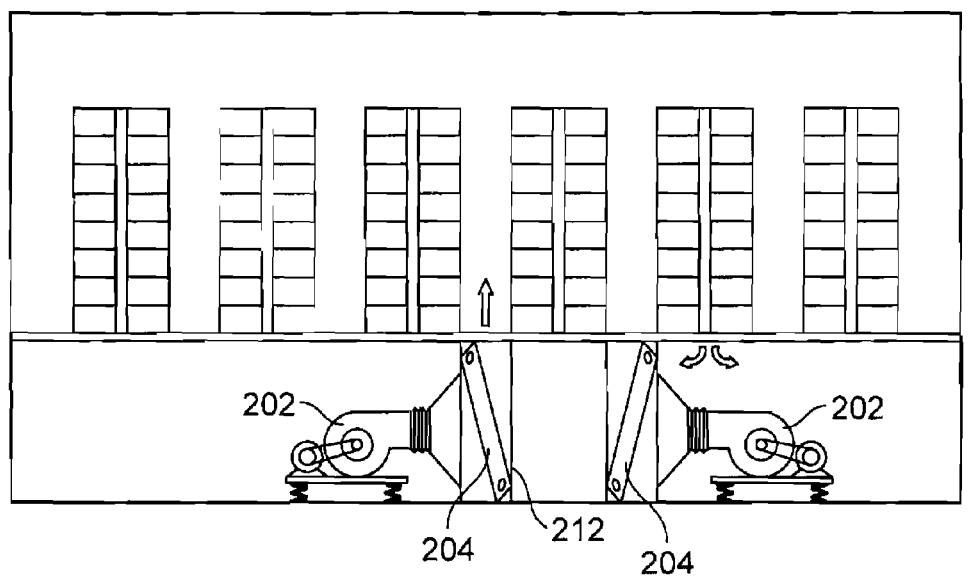

FIG. 2a shows a plan view of a data center having clustered fan coil units, while FIG. 2b shows a sectional view of the data center from FIG. 2a. In general, these figures show a particular type of fan-coil arrangement. In this example, fans are oriented with respect to their corresponding cooling coils so that fans are clustered in one area, and the cluster may be easier to serve with electrical services and general maintenance and other servicing. One such cluster is shown by fans 202 serving coils 204. In this example, various coils 204 are shown in alignment such as being aligned with workspace aisles in a data center above. As can be seen in sectional FIG. 2b, the coils 204, in this example, are not located flush or nearly flush with the floor of the space above as in the prior example, but are instead angled inside coil plenums 212. The coil plenums 212 may be created by erecting a rectangular box of sheet metal that extends from the floor of the under-floor space to the ceiling of the under-floor space, which may be at or near the floor of the workspace in the data center 200. The coils 204 may be angled within the plenum 212 so as to permit larger coils, in terms of surface area, to serve the area for cooling. In particular, if the coils 204 were flush with the floor above, their widths would be limited to the width of the aisles in the data center's workspace above. By angling the coils 204 in the vertical dimension, wider coils may be used. In addition, the coils 204 may be accessed more easily in the under-floor space if they may be placed closer to the floor of the under-floor space.

The difference in pressure across the coil 204 in coil plenum 212 may simply be a pressure that is needed to overcome a pressure drop through the coils 204 plus a slight additional pressure drop for moving the air up through the floor and to the front of the computer racks in the workspace above.

The plenums 212 include two zones because of the positioning of the coils 204. In particular, the zone on the upstream side of the coils 204 may be a warm air zone or warm air plenum, while the zone on the downstream side of the coils may be a cool air zone or cool air plenum, including a plenum that is in fluid communication with the workspace above. Appropriate sealing or other mechanisms such as gaskets may be provided around the coils to prevent leakage of air from the warm air side to the cool air side.

As noted, the clustering of mechanical equipment such as fans 202 and motors in a single area may provide efficiencies for electrical service. For example, a single electrical service panel 214 may be provided near the cluster of fans 202, and may include the necessary equipment to serve the fans 202. For example, the panel 214 may include circuit breakers, shut-off mechanisms, other isolation mechanisms, grounding equipment, and motor controls, as needed to operate the motors and fans 202. As a result, installers may more easily provide such equipment, and technicians may more readily access the equipment for servicing. One or more portions of the service panel, such as a shut-off mechanism, may be located in a more accessible location.

Figure 3A:
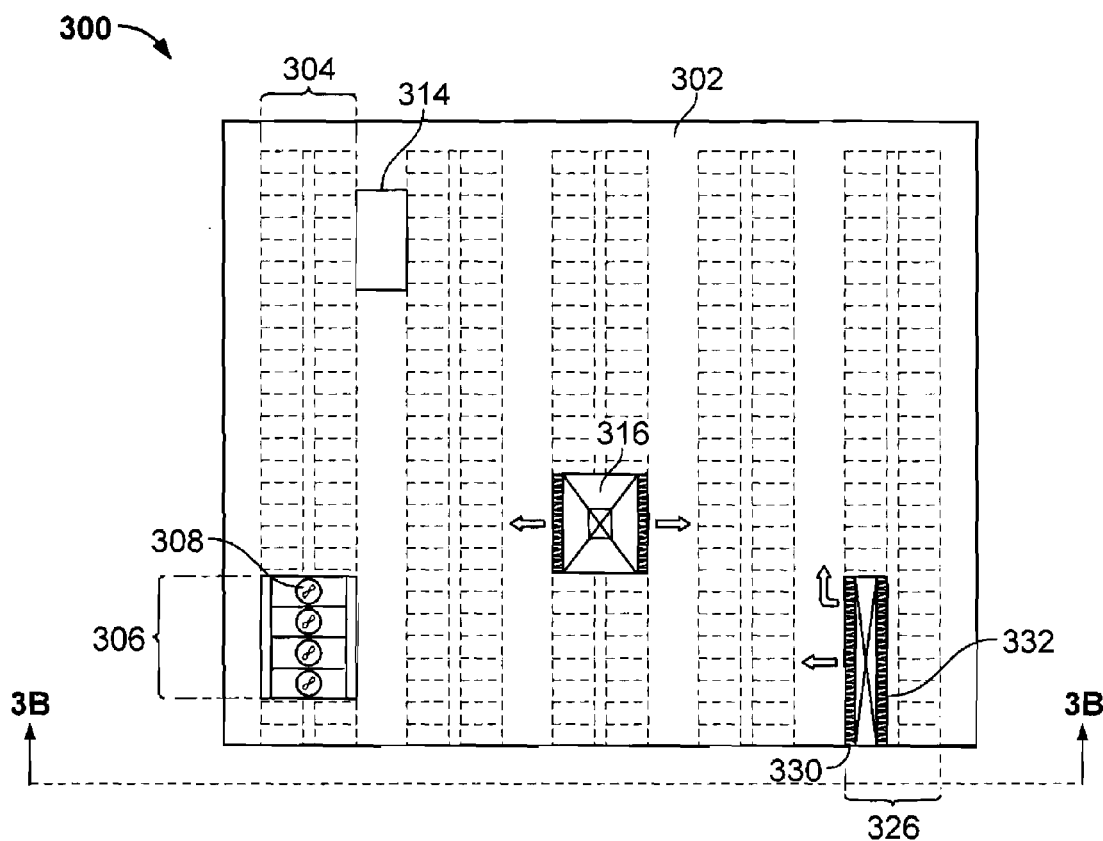
FIG. 3a shows a plan view of a data center having a variety of air circulation and cooling sub-systems.
Figure 3B:
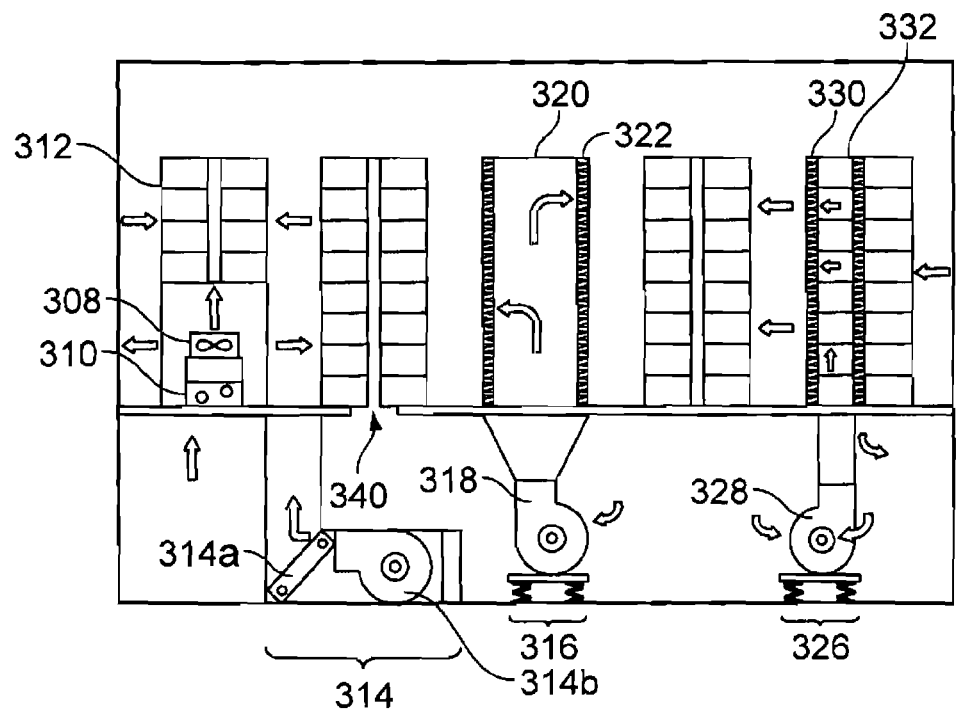
Figure 3C:
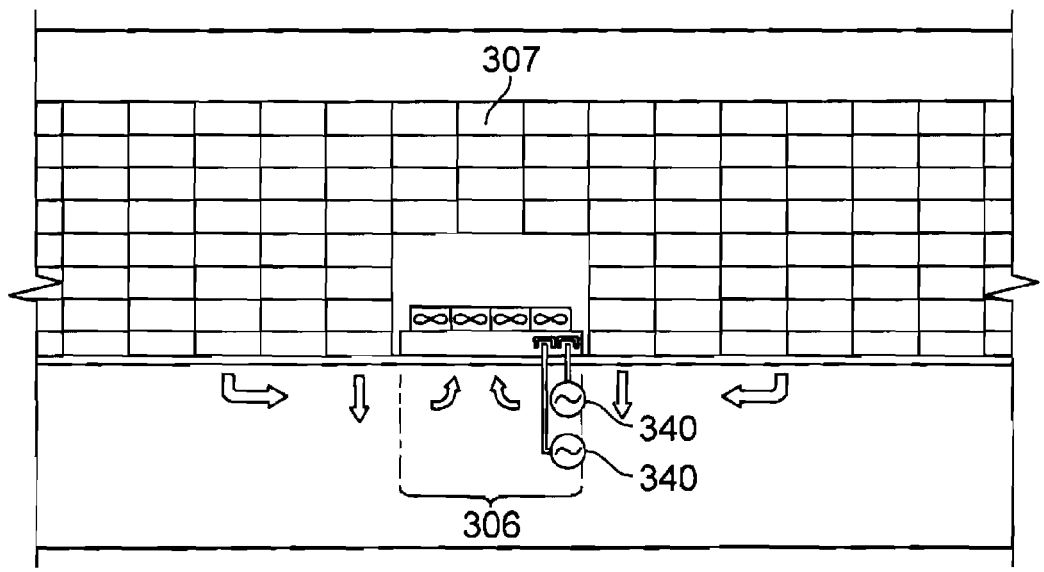
FIG. 3c shows a sectional view of a particular unit from FIG. 3b.

FIG. 3a shows a view of a data center 300 having a variety of air circulation and cooling sub-systems, while FIG. 3b shows a sectional view of the data center 300 from FIG. 3a, and FIG. 3c shows a sectional view of a particular cooling unit 306 from FIG. 3a. These figures generally show a variety of different arrangements for fan-coil units provided with an under-floor warm air plenum in a data center cooling system. The examples shown here again relate to a data center arranged around parallel rows of back-to-back computer units that expel their heated air into vertical plenums that then release the air through a floor of the data center into the under-floor space. Other arrangements may also be employed, of course.

Such an arrangement of computers is exemplified by row 304. Row 304 may include a first row of computer racks and a second row of computer racks that are spaced apart at the back edges by a relatively narrow open area between the racks. Where the computer racks are located, air may be drawn from a workspace 302 in the data center 300 into the fronts of the computer units in the racks and out the back of the computer units and then downward into the under-floor space. In such an example, the space between the rows of racks serves as a vertical warm air plenum, while the workspace serves as a cool air plenum.

As a first example, of an arrangement for providing cooling and circulation of air in the data center 300, a cooling unit 306 is shown provided in line with the cooling racks in row 304. The particular cooling unit 306 includes one or more cooling coils 310 and may have axial circulation fans 308 located above the coil or coils 310. Such a cooling unit 306 may be placed directly on the floor of the data center, over a cutout located in the floor beneath the coils 310. In this manner, the fans 308 may drawn warm air up from the area below the floor and through the coils 310, and then expel the air out the sides of the row 304 and into the workspace 302, where it may be circulated through the system again.

The unit 306 may be part of a specially equipped portion of a rack in the data center, where components that would normally be computers in the rack are replaced with the coils 310 and fans 308. By this arrangement, the cooling unit 306 may be located with flexibility wherever an operator of the data center 300 believes additional cooling may be needed. In such a situation, a pair of computer racks on either side of row 304 may be removed, and unit 306 may be placed where the racks were previously located. Access panels to the under-floor space may also be removed so as to increase the area through which air may flow from a previously narrow area underneath the hot air plenum that was located between the computer racks, to include an area sufficient to provide air to coil 310.

Alternatively, the opening for passing hot air into the under-floor space under racks may be over-sized, as shown by opening 340, for passing of air downward. The over-sized portion of the opening 340 may normally be blocked by the trays or rack holding the computer units above the opening 340, and by sealing mechanisms between the bottom of a computer rack and the floor, so that air from workspace 302 does not mix with the heated under-floor air. The opening 340 may be properly sized for a fan-coil unit such as unit 306, however, so that when the computer racks are removed and replaced with a fan-coil unit, the opening may operate properly with the fan-coil unit.

As can be seen most clearly in FIG. 3c, the unit 306 may rest in-line with other computer racks, and may also be provided with computers 307 in an area above the unit 306. Such computers may be located above a level that is needed to circulate cool air out and away from unit 306, and may permit for additional density in locating computers inside data center 300.

An alternative approach to providing circulation and cooling to data center 300 is shown by cooling unit 314. In this example, a packaged commercial fan-coil unit is located on the floor of the under-floor space. The packaged unit may include a cooling coil 314a and a fan 314b in a familiar arrangement. The packaged fan coil unit 314 may be any of a number of types of commercially available fan coil units they may be obtained from companies such TRANE, CARRIER, and others. The fan coil unit 314 may in turn be opened to the under-floor space at its intake, but may include a filter (such as a filter operating at a coarse or pre-filter level) at its opening, and may be ducted to an opening in the floor so as to provide cooled air back into the workspace 302. In full implementation, multiple packaged fan-coil units would be scattered across an under-floor area.

In this manner, unit 314 may conveniently provide air circulation and cooling similar to the mechanisms described elsewhere in this document, but may be more readily obtained and installed where fast up-time is needed for a facility.

Unit 316 shows another fan-coil arrangement that may be used to provide air from a below-floor space into a workspace, and to cool the air. Here, the cooling coils 322 are located vertically as part of a replacement for a computer rack. The coils 322 may be located, for example, at the side faces of a frame that is transportable and sized to slide into the space normally reserved for a computer rack. Such an arrangement may permit for coils having very large surface areas, and thus having low impedance to airflow. A protective panel may be provided over each coil to prevent damage to the coil from people in the workspace 302.

A fan 318 draws warm air from the under-floor space and directs it into a plenum 320 created between coils 322. The elevated pressure created by the fan 318 may force the air out through the coils, where it may be cooled, and additional air may be drawn in from the under-floor space. In an alternative arrangement, the fan 318 may be located between the coils 322 above the floor level and may discharge air into the space between the coils 322. In such an arrangement, the air intake for the fan 318 may be ducted down to the under-floor space so as to draw in warm air and maintain a positive pressure in the plenum 320.

An arrangement similar to unit 316 is shown by unit 326. In this arrangement, however, the ventilation is set up to come out of only one side of a back-to-back row of servers. Thus, the unit 326 includes a fan 328 that is arranged similarly to fan 318 of unit 316, and also includes a cooling coil 330 at a face of one row of computer racks. However, the unit 326 does not direct air to the other side of the computer racks, which instead are filled with computer racks. A baffle between a warm air plenum 332 that draws air away from the computers, and the pressurized plenum behind the coil 330, prevents mixing of such air and permits proper pressurization of both zones. Again, fan 328 may be placed above the floor in the space behind coil 330, and in such an example, may include a bank of axial flow fans, like in unit 306, which may be set against the floor.

FIG. 3c also shows an example piping connection for a unit such as unit 306. As is shown, cooling water piping 340 runs below the floor level, with take-offs or taps running upward to the cooling coil. In certain implementations, a small pump or pumps may be located near the cooling coil to provide assistance or better control over the circulation of cooling water through the coil. In addition, though not shown, shut-off valves may be provided to permit easy connection and disconnection of the coil without interfering with operation of the system, and control valves may also be provided to control the amount of cooling water that is provided to the coil. An access panel may be provided in the floor near any shut off valves so that personnel can easily reach the valves without having to go into the under-floor space. Where there is a pressure differential between the under-floor space and the above-floor space, sealing materials may be provided around the access panel and at other points along the floor level.

In one example, a temperature sensor may also be provided in the workspace in a data center, and the various cooling coils may be throttled or boosted to maintain a temperature set point for the workspace. The fans may, in turn, be speed-controlled to maintain particular pressure differentials in the system. For example, fans provided with the computer units may be controlled to provide a particular temperature rise across a board or to maintain a particular pressure between the workspace and an exhaust portion for a board. Fans serving the under-floor space may then be controlled to maintain a set pressure difference between the backs of the computers and the workspace (i.e., to overcome the pressure drop of the warm air plenums, the cooling coils, and any other equipment such as filters and the like).

Figure 4A:
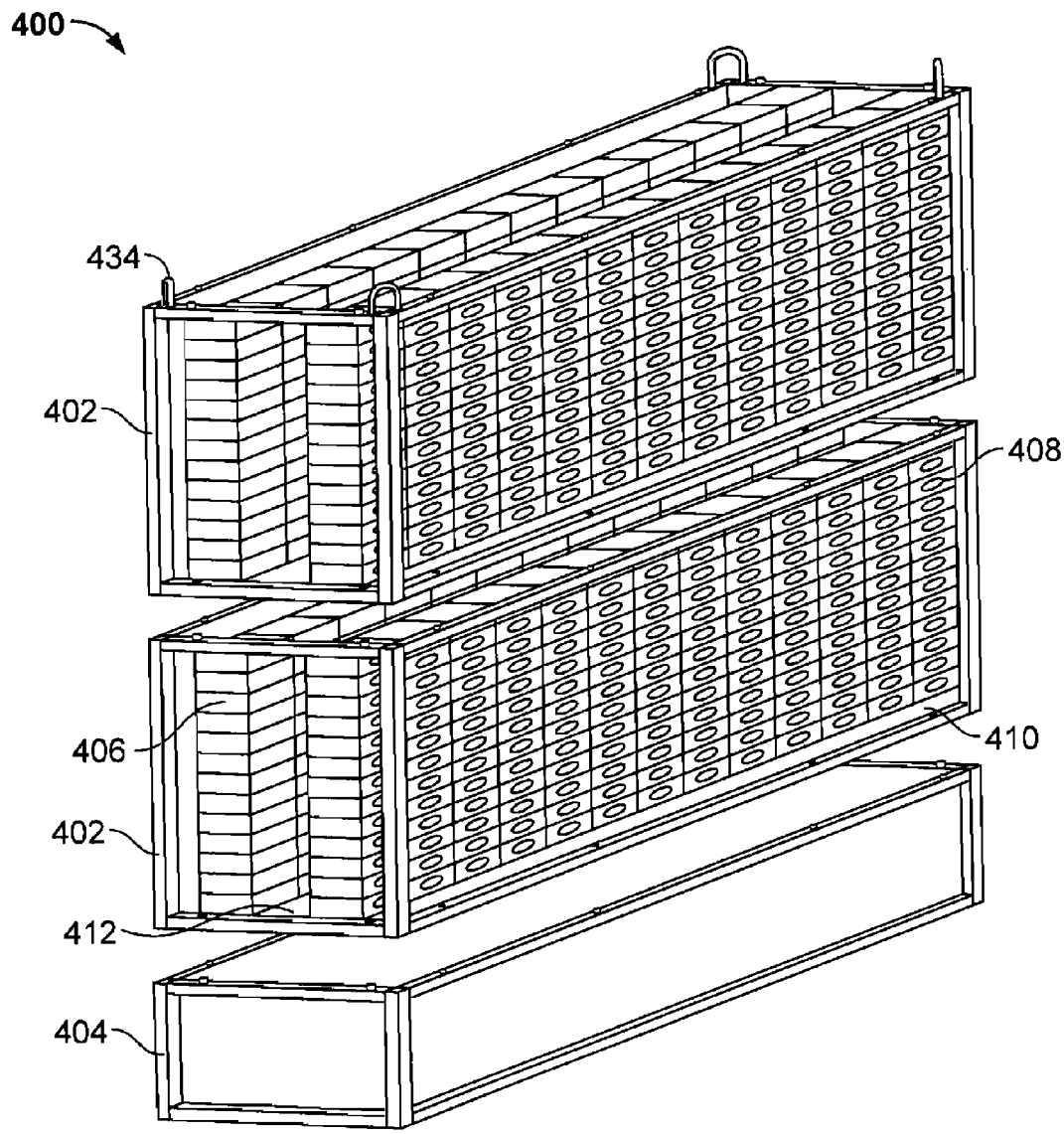
FIG. 4a shows a isometric view of a modular, stacked data center.
Figure 4B:
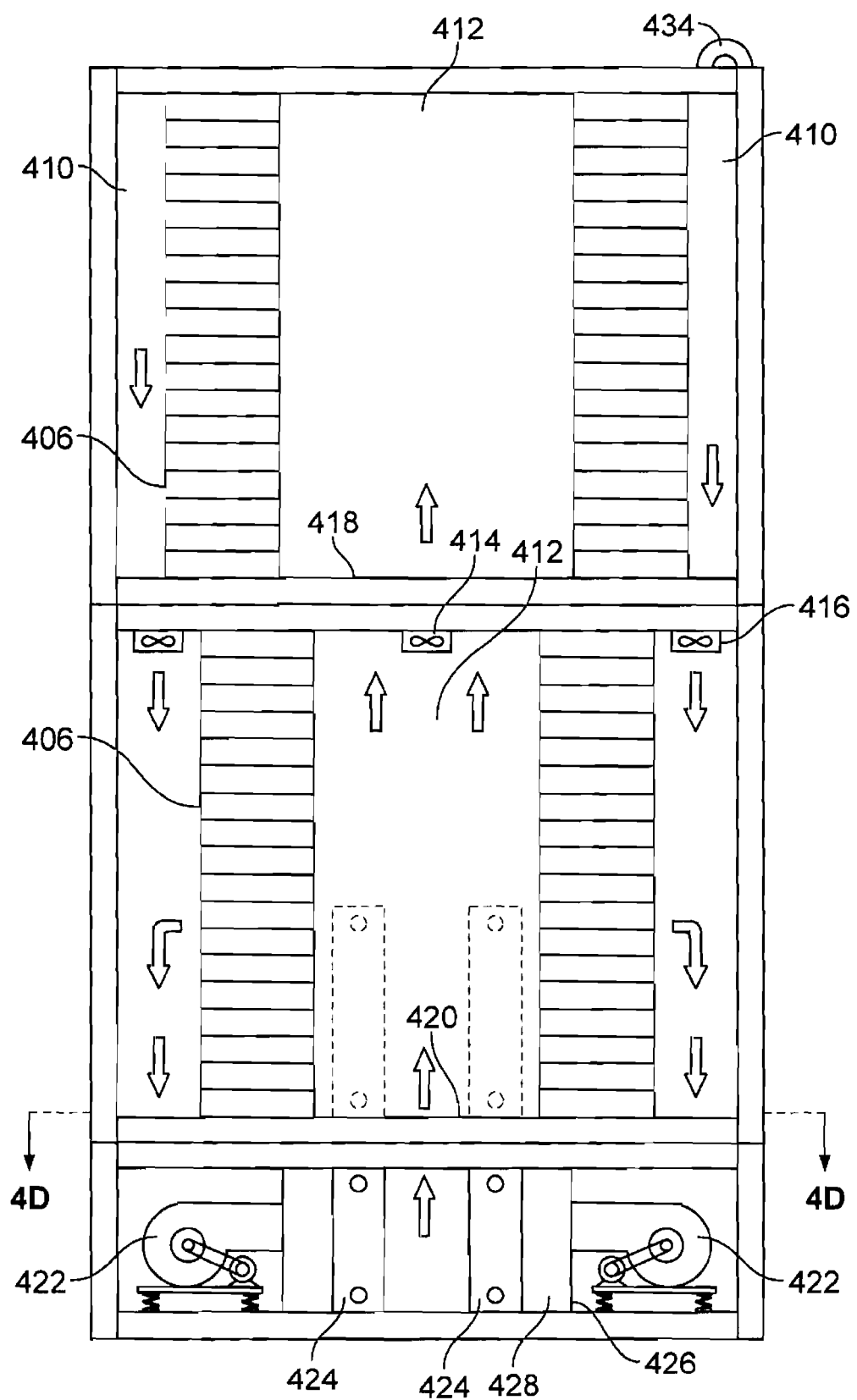

FIG. 4a shows an isometric exploded view of a modular, stacked data center 400, and FIG. 4b shows an end section view of that same data center 400. In general, the data center 400 exhibits many of the features already discussed, but in a form factor that can be factory constructed, transported to a site, and quickly erected at the site. In this example, the data center 400 includes three modules: a mechanical base module 404, and two computing modules 402. Additional levels of modules may also be used. The computing modules 402 may take the form of a box beam frame that supports two rows of computer racks that are separated by a central aisle.

The computing modules 402 may each be approximately the size of a standard shipping container so that they may be loaded easily on a trailer of a commercial tractor trailer (or may actually serve as the structure of the trailer, as with shipping containers). In this manner, the modules 402 may be transported easily to a construction site, and may also be covered with tarpaulin or other materials so that the equipment in them can be obscured from view and from the elements during transport.

Generally, the frames of the computing modules 402 may be formed of standard welded steel box beam or rolled or formed channels. Support pieces (not shown, for clarity) may be placed along the ends and sides of the modules 402 as is needed for structural support. In this example, the modules 402, 404 are shown having generally matching dimensions so that they may be stacked on top of each other in a modular fashion, including by forming a rectangular grid of modules in the horizontal dimension and stacking modules in the vertical dimension, much like the stacking of LEGO blocks. To further extend the analogy to LEGO blocks, and to provide for proper alignment and sealing of modules on top of each other, cylindrical extensions may be provided along the upper portion (e.g., along the periphery) of modules and matching cylindrical insets may be applied along the lower portions of other modules (see FIG. 4c). The extensions and insets may be made from any appropriate material, and certain strong plastics may be used so that some "give" may be experienced as the modules slide on top of each other. Also, the particular plastic may be color-coded (e.g., blue, red, or yellow) so that assemblers in the field may more readily match modules that are designed to fit together. Alternatively, standard container corner fittings may be used, and forklift pockets may be provided for maneuverability (not shown).

The modules 402 may also be partially or wholly skinned before transport to a site. For example, if a module is intended to be a top module in a stack when it is installed, it may have a roof applied to it before shipping—similar approaches may be used for walls of end modules. Other internal areas may be left unskinned and open to adjoining modules. Thus, after the modules are installed, the modules may be open to movement of people and air within a grid of modules, which differs from implementations that might have every module closed upon installation. Also, although both computing modules 402 show computers running from one end all the way to the other end of the modules 402, the computer racks may be stopped short of the end of the modules so as to permit workers to move laterally from one module to the next along one end.

Thus, a full-scale installation could involve a grid of a dozen or more modules in two directions. In the lengthwise direction, long rows of computers and long aisles between the rows may be created. In the cross-wise direction, multiple rows of computers and multiple workspace aisles may be provided. The inside workspace of the data center then may be relatively indistinguishable from the layout shown in FIG. 1a, for example.

The modules 402, 404 may be installed outdoors or indoors. For outdoor installation, the modules 402, 404 may be skinned on or off-site and may be sealed to maintain appropriate pressure and keep the elements out. Various utility services, including air, water, and electrical may be provided to the modules 402, 404. Also, utility plants may be provided adjacent to the modules 402, 404, such as in the form of cooling towers and modules that hold pumps, heat exchangers, and other mechanical and electrical equipment. Such equipment may be located in modules similar in form factor to modules 402, 404. These will be referred to as service modules. For example, pumps and heat exchangers may be located in the modules (as may chillers when such are anticipated to be necessary for high temperature days) that are installed adjacent to modules 402, and piping headers may be installed in modules that are installed adjacent to module 404. All of the modules may then be connected together, with the piping header modules connecting to piping running through module 404, and cooling towers being mounted on top of the other service modules.

Particular components within modules 402, 404, and their arrangement, are best seen in FIG. 4b. (Certain detail, including the equipment in module 404, has been eliminated from FIG. 4a for clarity.) Rows of computer racks 406 are shown with their front edges forming a central corridor through which workers may pass, and with their back edges forming vertical warm air plenums 410 at the perimeter of the modules 402. In operation, air may be drawn from the aisle 412, across the computers, and into the vertical warm-air plenums 410. The floor of the top computing module 402 and the ceiling of the bottom computing module 402 may be perforated, left open, or otherwise be in fluid communication so that the warm air may flow all the way down the exterior walls of the computing modules 402 and into the mechanical module 404. As shown in this example, the racks 406 in the lower module may be positioned farther inward than are the racks 406 in the upper module 402 because the warm-air plenum 410 of the lower module 402 needs to carry air exhausted by computers in both modules. By creating the additional area in the lower module, the aisle of the lower module is slightly narrower than is the aisle in the upper module, but the velocity of the air in the warm air plenum may be kept fairly equal, and the pressure drop may be minimized. In addition, an optional circulation assist fan 416 is shown to provide additional momentum to the warm air coming down from the upper module 402. A control system may be used in conjunction with fan 416 to correctly manage airflow. A row of such fans may, in appropriate circumstances, be placed along the length of the modules 402.

When the warm air is circulated down to the mechanical module 404, it is taken up, on each side, by a row of fans 422. In this example, the fans 422 are centrifugal fans, though other forms of fans may be readily used. A pair of baffles 426 split the below-floor space into lower pressure areas around the fans 422 and higher pressure area in front of the fan exit points. Cooling coils 424 are located at the other side of the higher pressure areas, so that air passes through the coils 424, is cooled, and then moves upward into aisle 412 in the lower computer module 402. The floor of the module 402 may be perforated or mesh so as to permit the cooled air to pass upward more freely.

Various arrangements may be provided in the central aisle 412 to assist in the operation of the data center. First, a circulation assist fan 414 may be provided where the upper and lower computing modules 402 meet each other, so as to help more cool air from coils 424 reach the upper module, and to prevent the air from short-circuiting through computers near the bottom of the lower computing module 402.

Also, dashed lines above coils 424 show areas for coil removal for service or replacement. In particular, if the coils 424 fail or otherwise need service, zones above the coils may be provided where technicians can readily draw the coils upward, such as by lifting loops or handles on the coils 424. Also, access panels may be sized so that fans 422 may be removed through the workspace, such as by sliding the fans forward on rails and then lifting them out of the unit 404 after removing the interfering coils and disconnecting fan electrical service. In an alternative arrangement, and because fans typically need more servicing than do coils, the fans 422 may be located between the coils 424 and below the central aisle 412. The fans 422, in such a situation, may draw air through the coils (which may seal off between a warm air plenum between the coils and the outer walls of the unit 404, and a low pressure cool air plenum between the coils.

Figure 4C:
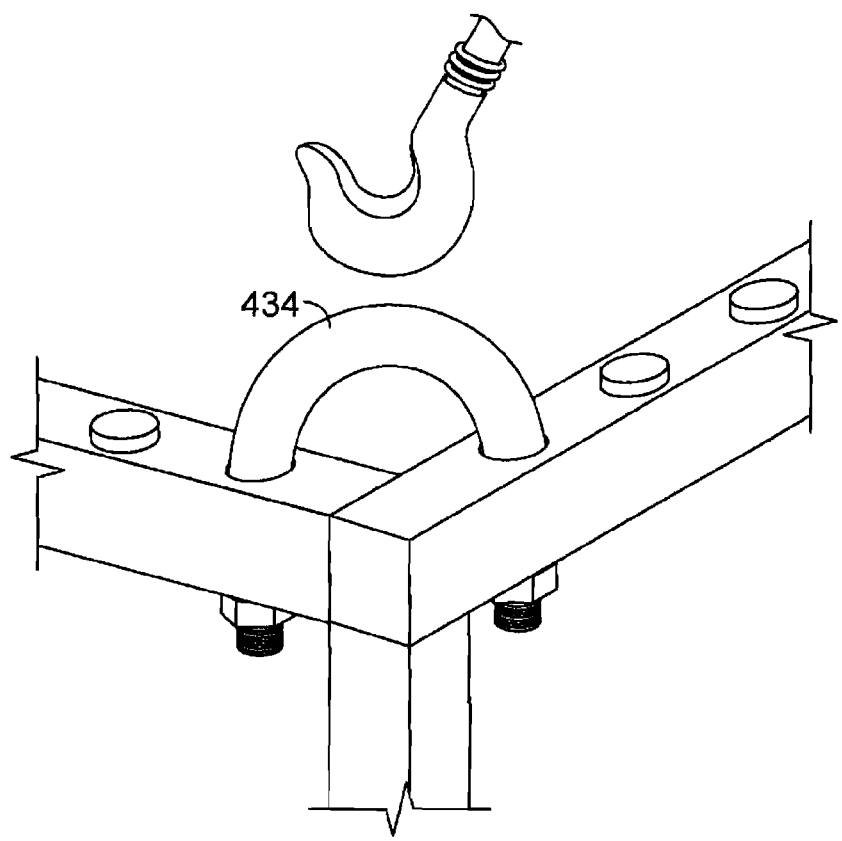

FIG. 4c shows a detail view of a lifting connector for the data center of FIG. 4a. The connector includes a hook loop 434 that may be mounted in each corner of a unit and be positioned so as to be hooked by a crane for lifting the unit into place. The loop 434 may then be removed by unbolting after the unit has been placed so that, for example, an additional unit may be placed on top of the first unit. Also, the cylindrical LEGO-like connectors between units are shown in this figure along the periphery of the unit frame. The lifting hook may also be recessed into the structure of the module so as to not require any removal after installation. As mentioned above, corner fittings like those used on standard inter-modal shipping containers, may also be used.

Figure 4D:
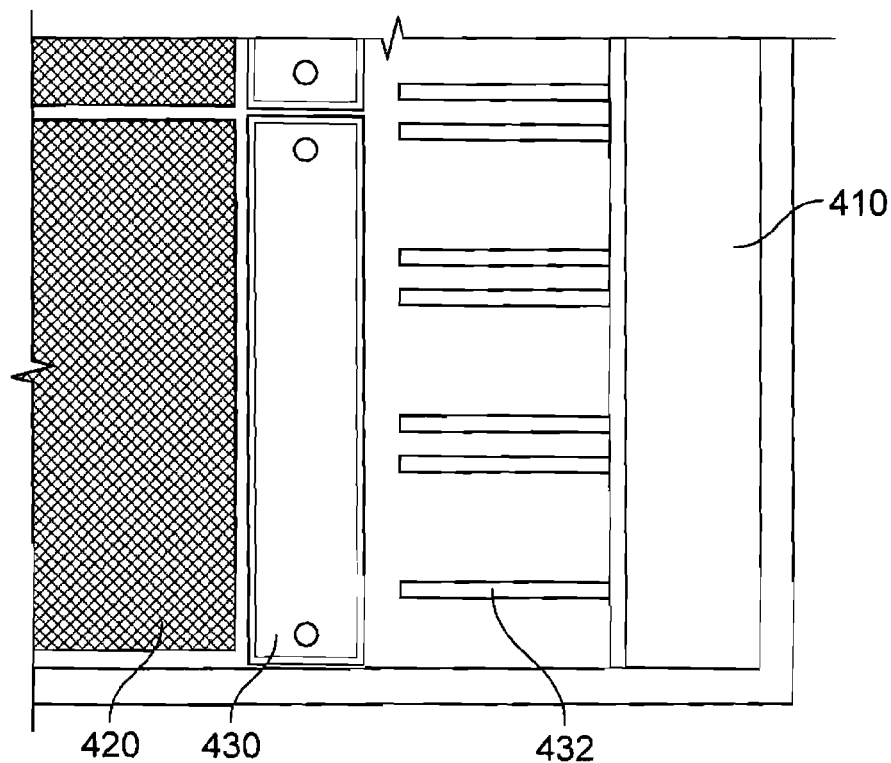

FIG. 4d shows a partial plan view of the data center of FIG. 4a. In particular, this view shows particular detailed structures that may be provided in the floor of a computing data center 402. Along the outer edge of the unit is a warm-air plenum 410 that is open to the space below the unit so that warm air may travel freely down to an under-floor space. The plenum 410 may be sized to pass sufficient air downward even if the particular unit is the bottom unit in a stack and thus needs to pass the air for multiple units.

Particular racks in the unit may be positioned and slid backward or forward along tracks 432. Specifically, in a lower unit, the racks may be slide forward so as to expose all of plenum 410, and in upper units, the racks may be slid backward to block some of plenum 410, but in turn to make a central aisle of the unit wider. The tracks 432 may take a variety of forms, such as raised ribs in the floor along which wheels on the bottoms of the racks may roll. (The wheels may be locked when the rack is in place and rack may be secured near its top and bottom to prevent it from tipping, particularly during earthquakes, transport, and the like.) The tracks 432 may also be indentations in the unit floor into which wheels or other structures on the bottom of the racks may be placed and may slide forward and backward.

Access panel 430 may provide ready access to coils and valving location below the computing unit floor. For example tabs or screws at each end or corner of the panel 430 may be loosened or removed, the access panel 430 may be lifted upward, and a coil below may be lifted out of the below-floor space once it has been disconnected.

A floor grate 420 may likewise permit access to the under-floor space, and more particularly may permit cool air to flow up from the under-floor space and into the aisle of the unit. Where fans are located below the grate 420, the grate may be lifted out of place to provide access for servicing and replacing the fans, fan motors, or other equipment.

Figure 5:
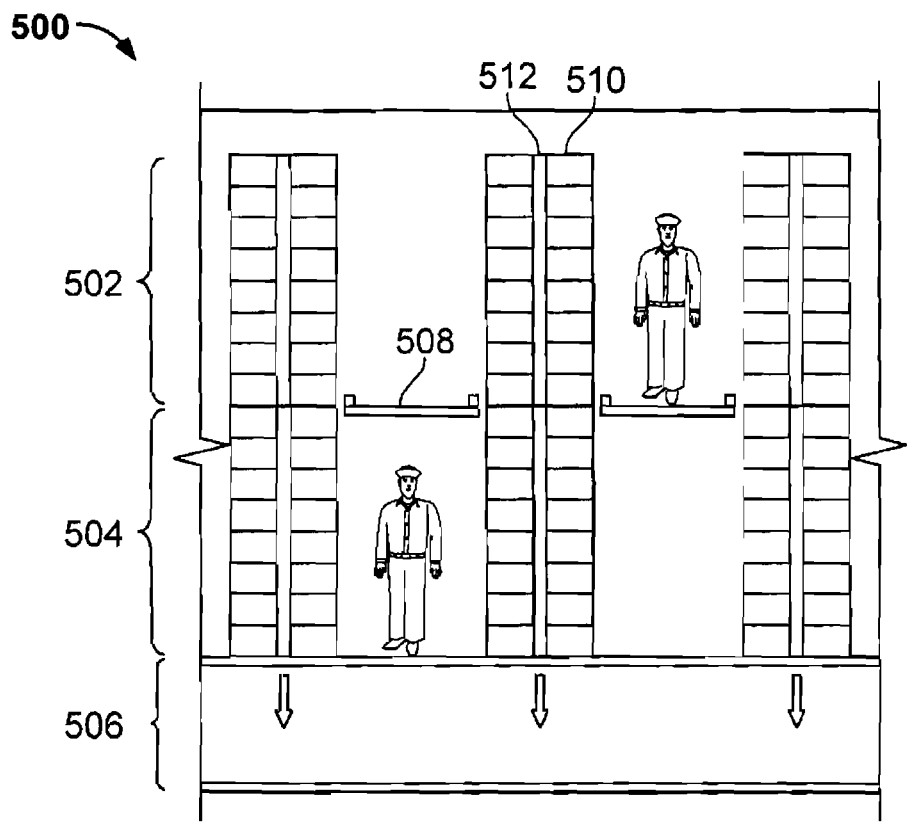
FIG. 5 is a sectional view of a multi-level fixed data center.

FIG. 5 is a sectional view of a multi-level fixed data center 500. In general, this data center 500 is similar in arrangement to others described and shown above, but is a double-decker so as to fit more computing power into an equal footprint. In this example, the data center 500 is arranged like shelves in the "stacks" section of a library, where the racks pass continuously upward from floor to floor. As in the prior figures, a row may include a pair of racks 510 on each side of a warm air plenum 512. The computing area of the center 500 includes an upper level 502 and a lower level 504, and an under-floor area 506 is also provided for receiving air warmed by the computers in the racks. Mechanical equipment for circulating and cooling the air has been omitted for clarity, but may take a variety of forms and arrangements, including those described above.

Access to the racks at the upper level is provided by walkway 508. The walkway may be an elevated walk provided between and support between adjacent rows of computer racks. The walkway may be located vertically so as to permit convenient access to computers at all levels of the facility by workers in the facility.

Figure 6:
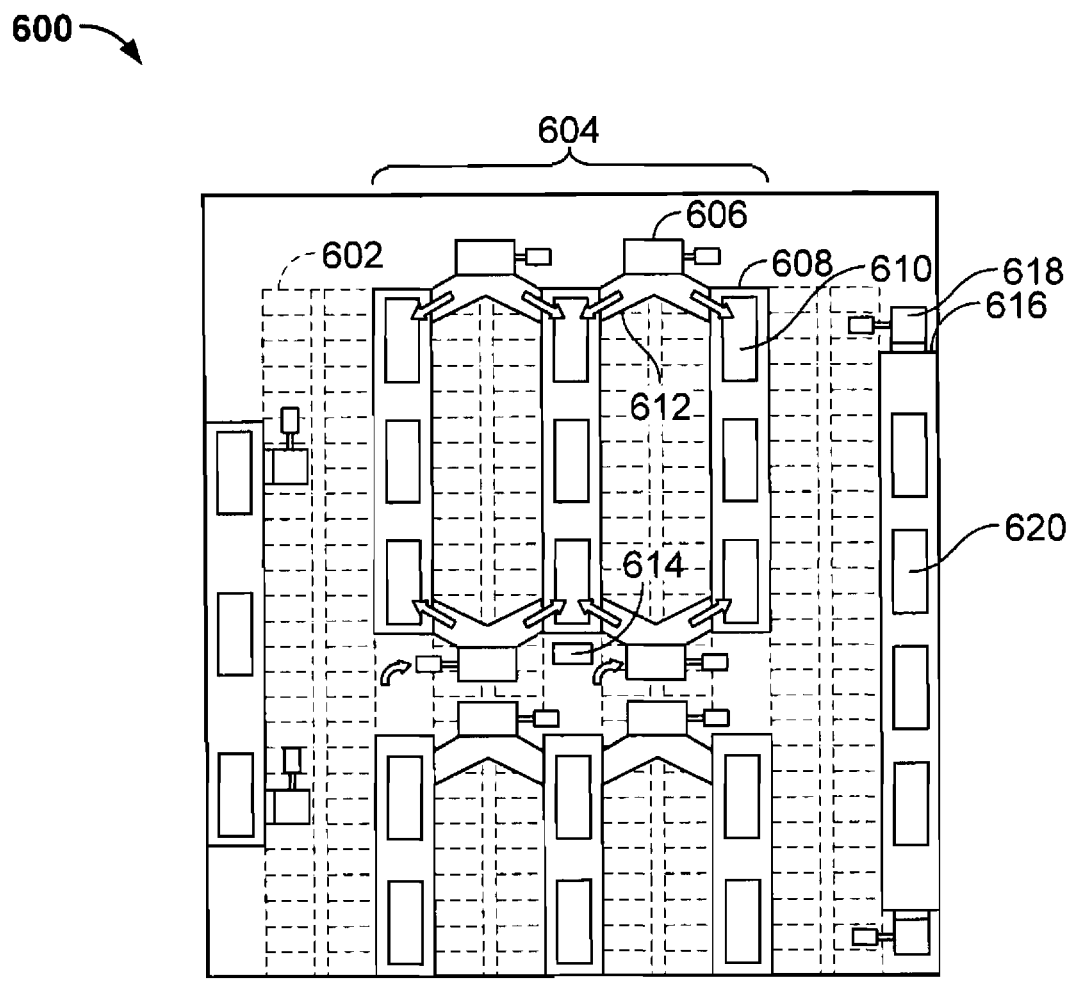
FIG. 6 is a plan view of a data center using shared high-pressure warm-air plenums.

FIG. 6 shows a plan view of a data center using shared high-pressure warm-air plenums. In this example, multiple plenums are constructed in a below-floor space, such as by building walls from the floor of the below-floor space to the ceiling of the below-floor space and sealing the edges of the plenums. One example plenum is plenum 608, whose interior space may be located beneath a plurality of cooling coils such as coil 610 located at or near a floor of the data center. Pressurized air that enters the plenum 608 may be directed upward through coil 610 and into the workspace above, in a manner similar to other systems described above. The components may be located immediately under rows of computer racks 602 in the space above.

The air may be driven into plenum 608 by various fans such as fan 606. The fan 606 draws warm air from the main area of the below-floor plenum and transfers it under pressure into the plenum 608. In this example, fan 606 is one of four fans in a group 604 serving three different plenums. Such duplication permits for additional diversity in the system in manners similar to the other systems discussed above. In particular, if one fan in the group breaks down or is otherwise taken out of service, the remaining fans may keep the plenums pressurized so that air continues to circulate through the cooling coils. Also, the fans may be sized and selected so as to operate well, on their fan curves, both at a level in which all four fans are operating, and at a level at which only three of the fans are operating. A motor control center 614 may interact with a control system so as to provide consistent air flow, even when one fan is out of service, and certain aspects of the center 614 may be located in more accessible locations, such as for safety purposes.

As another example, a separate plenum 616 is shown along a side wall of the data center 600. This plenum 616 includes a single row of coils 620 at its upper surface, and is pressurized by two fans, including fan 618. Again, diversity for the system may be obtained by having multiple fans and multiple coils on a common plenum, so that other fans or coils may take of the slack if one piece of equipment fails.

Figure 7:
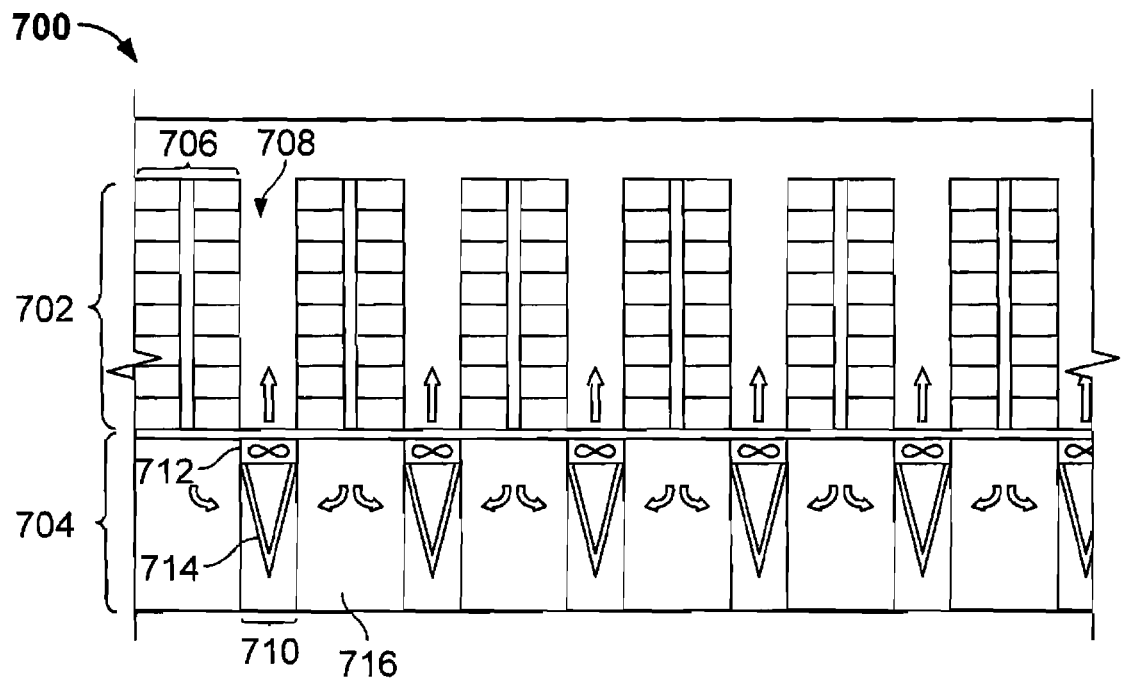
FIG. 7 is a sectional view of a data center having below-floor air circulation and cooling units.

FIG. 7 shows a section view of a system using modular under-floor fan-coil units 710. The components used with this system may be arranged in a manner similar to those in FIGS. 1a-1b. In particular, fan-coil units 710 may be in an under-floor space that serves as a warm air plenum that receives heated air from computer racks 706 above the floor. The fan-coil units 710 may be positioned and arranged so as to direct cooled air up into workspace aisles 708 in the datacenter 700.

In this example, the fan-coil units 710 may each include a rectangular frame having axial fans 712 at its upper surface and cooling coils 714 arranged in a v-formation inside the frame. The fans may draw air from the under-floor space 716 through the coils and may expel it into the workspace as cooled air. Each of the units may have a length that is convenient for off-site construction, followed by transportation and installation on-site. For example, each unit 710 may be approximately 5-10 feet wide and may be provided with skids on its bottom edge so that it can be picked up easily by a forklift, moved onto and off of trucks, and moved into position in a data center. Each such unit may be a standalone unit under, for example, a single coil. In such an arrangement, the sides of the units near the downstream portions of the coils would need to be covered and sealed to prevent cooled air from re-entering the warm air plenum.

Alternatively, the units may be provided in a row running parallel under the workspace aisles above. The ends of the units may then be left open to each other so that cool air may flow up and down the row above the coils. In such an arrangement, if fans in one unit stop, the air entering the coils of that unit could be drawn outward and upward by fans in adjacent units in the row. Again, such an arrangement may provide additional diversity in the system so that the system may better handle isolated equipment failures.

For each of the forms of units described above, automatic dampers may be used in appropriate circumstances to prevent the passage of air when a unit is not operating. Other such accessories may also be provided to improve the circulation of air and the efficiency with which it is circulation.

A number of embodiments have been described. Nevertheless, it will be understood that various modifications may be made without departing from the spirit and scope of the disclosures in this document. For example, additional components may be added to those shown above, or components may be removed or rearranged. Also particular values for temperatures and other such values may be varied. Moreover, steps in processes may be rearranged, added, or removed as appropriate. Accordingly, other embodiments are within the scope of the following claims.

What is claimed is:
1. A data center cooling system, comprising:
a floor structure defining a below-floor warm-air plenum and an above-floor cool air plenum;
a plurality of above-floor computer assemblies arranged to exhaust warmed air into the warm-air plenum;
one or more fan-coil arrangements to circulate air from the warm-air plenum, cool the air, and provide the air to the cool air plenum;
a vertical plenum fluidly connecting the computer assemblies to the warm-air plenum through an opening defined in the floor structure; and
one or more assist fans configured to circulate warmed air downward through the vertical plenum towards the one or more fan-coil arrangements,
wherein each of the plurality of above-floor computer assemblies is adjacent to a human-occupiable walkway that is part of the above-floor cool air plenum within a data center building and comprises a rack having a cabinet that at least partially houses a plurality of heat generating devices that are accessible from the human-occupiable walkway,
a first portion of the plurality of above-floor computer assemblies is enclosed within a first modular frame that comprises the floor structure, and
the one or more fan-coil arrangements is enclosed within a second modular frame that is separate from and attached to the first modular frame, and arranged so that warmed air is circulated by the one or more fan coil arrangements from a portion of the above-floor plenum at least partially enclosed within the first modular frames to the fan-coil arrangements and to the walkway, the first and second modular frames having substantially similar lengths and widths.

2. The system of claim 1, wherein the one or more fan-coil arrangements include one or more packaged fan-coil units.

3. The system of claim 1, wherein the warm-air plenum and the cool-air plenum are sized in volume to substantially eliminate temperature hot spots created by failures of the fan-coil arrangements.

4. The system of claim 1, wherein the warm-air plenum defines a volume that is at least 20 percent as large as a volume defined by the cool-air plenum.

5. The system of claim 1, wherein the plurality of computer assemblies comprise a plurality of vertical racks arranged in a row exhausting warmed air into a vertical plenum that is in fluid communication with the below-floor warm air plenum.

6. The system of claim 1, further comprising:
air circulation fans adjacent to the computer assemblies and configured to draw cool air across the heat generating devices;

and fan controllers configured to maintain a set exit air temperature from the computer assemblies.

7. The system of claim 1, further comprising air circulation fans adjacent to the computer assemblies and fan controllers configured to maintain a maximum safe operating temperature for components on the computer assemblies.

8. The system of claim 1, further comprising a fan-coil assembly controller configured to maintain a set pressure difference between the warm-air plenum and the cool-air plenum.

9. The system of claim 8, wherein the set pressure difference is approximately zero.

10. The system of claim 1, wherein the one or more fan-coil arrangements comprise a plurality of fan-coil arrangements, and wherein each of the plurality of fan-coil arrangements is in fluid communication with each of the plurality of above-floor computer assemblies.

11. The system of claim 10, further comprising a plurality of cooling fluid supply conduits coupled to the plurality of fan-coil arrangements, wherein the plurality of cooling fluid supply conduits are arranged orthogonal to a plurality of rows of the plurality of above-floor computer assemblies.

12. The system of claim 11, wherein the plurality of cooling fluid supply conduits comprise:
a first cooling fluid supply conduit fluidly coupled between a fluid cooling source and a first portion of the plurality of fan-coil arrangements; and
a second cooling fluid supply conduit fluidly coupled between the fluid cooling source and a second portion of the plurality of fan-coil arrangements,
wherein the first portion of the plurality of fan-coil arrangements provides air to the cool air plenum adjacent a first portion of above-floor computer assemblies in a particular row of the plurality of rows, and the second portion of the plurality of fan-coil arrangements provides air to the cool air plenum adjacent a second portion of above-floor computer assemblies in the particular row of the plurality of rows.

13. The system of claim 1, wherein there is a greater quantity of cooling coils than quantity of fans in the plurality of fan-coil arrangements.

14. The system of claim 1, wherein a front side of the rack is open to the human-occupiable walkway.

15. The system of claim 1, wherein the one or more fan-coil arrangements are arranged underneath the floor structure and configured to circulate cool air from the warm-air plenum to the above-floor cool air plenum enclosed within the first and second modular frames.

16. The system of claim 15, wherein the one or more fan-coil arrangements are configured to circulate cool air from the warm-air plenum to the above-floor cool air plenum enclosed within the first modular frame.

17. The system of claim 1, wherein the one or more fan-coil arrangements are positioned in a draw-through arrangement to draw air from the warm-air plenum, cool the air, and provide the air to the cool air plenum.

18. A data center cooling system, comprising:
a human-occupiable data center workspace providing cooling air to a plurality of computer assemblies;
a warm-air plenum receiving air circulated past and warmed by the computer assemblies;
a data center floor defining, at least in part, a barrier between the data center workspace and the warm-air plenum;
a vertical plenum fluidly connecting the computer assemblies to the warm-air plenum through an opening defined in the data center floor; and
one or more assist fans configured to circulate warmed air downward through the vertical plenum towards one or more air conditioning modules that are at least partially located in the warm-air plenum,
wherein the human-occupiable data center workspace defines a plenum above the data center floor and external to the plurality of computer assemblies that captures the cooling air from the one or more air conditioning modules,
the human-occupiable data center workspace is contained in one or more modular computing frames that contain the computer assemblies, and the warm-air plenum is contained in one or more modular mechanical frames separate from the one or more modular computing frames and configured to be attached to the one or more modular computing frames, at least one of the one or more modular computing frames having a length and width substantially identical to a length and width of an attached modular mechanical frame.

19. The system of claim 18, wherein the one or more air conditioning modules comprise a plurality of air circulation fans in the warm-air plenum and a plurality of cooling coils associated with the air circulation fans located at an edge of the warm-air plenum.

20. The system of claim 19, wherein the air circulation fans are configured to draw air out of the warm-air plenum and supply the air, after cooling by the cooling coils, to the human-occupiable data center workspace.

21. The system of claim 18, wherein the warm-air plenum comprises a human-occupiable mechanical workspace.

22. The system of claim 18, further comprising air circulation fans adjacent to the computer assemblies and configured to draw cool air across the computer assemblies.

23. A method of operating a cooling system for a data center, comprising:
circulating cool air from a warm air plenum using fans located in a first modular frame that at least partially defines the warm-air plenum, to a first above-floor cool air plenum that comprises a first human-occupiable workspace in a second modular frame;
circulating cool air to a second above-floor cool air plenum that comprises a second human-occupiable workspace in a third modular frame stacked on top of the second modular frame;
circulating the cool air from the first and second human-occupiable workspaces through a plurality of above-floor computer assemblies adjacent the workspaces and across a plurality of computers mounted in the above-floor computer assemblies to remove heat created by the computers by drawing the cool air across the computers using fans located adjacent the computers;
capturing air from the above-floor computer assemblies that is heated by the computers and directing the heated air into the warm air plenum through at least one fenestration in the second modular frame and the third modular frame; and
cooling the heated air with one or more coil arrangements in the second modular frame.

24. The method of claim 23, wherein the cool air is continuously circulated from the first and second human-occupiable workspaces through the plurality of above-floor computer assemblies within the workspaces and across the plurality of computers mounted in the above-floor computer assemblies to remove heat accumulated by the computers.

25. The method of claim 23, wherein the first modular frame is located below a floor of the second modular frame.

26. The method of claim 23, further comprising controlling the fans located adjacent the computers to maintain set exit air temperatures from the computers.

27. The method of claim 23, wherein the warm air plenum is at least 20 percent the volume of the above-floor cold-air plenum.

\* \* \* \* \*

UNITED STATES PATENT AND TRADEMARK OFFICE
CERTIFICATE OF CORRECTION

| | | |
|---|---|---|
| PATENT NO. | : 8,763,414 B2 | Page 1 of 1 |
| APPLICATION NO. | : 12/060165 | |
| DATED | : July 1, 2014 | |
| INVENTOR(S) | : Carlson et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 792 days.

Signed and Sealed this
Eighth Day of March, 2016

Michelle K. Lee
*Director of the United States Patent and Trademark Office*